(12) United States Patent
Cho et al.

(10) Patent No.: US 7,233,018 B2
(45) Date of Patent: Jun. 19, 2007

(54) HIGH VOLTAGE MOSFET HAVING SI/SIGE HETEROJUCTION STRUCTURE AND METHOD OF MANUFACTURING THE SAME

(75) Inventors: Young Kyun Cho, Jeollabuk-do (KR); Sung Ku Kwon, Daejeon (KR); Tae Moon Roh, Daejeon (KR); Dae Woo Lee, Daejeon (KR); Jong Dae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/182,671

(22) Filed: Jul. 15, 2005

(65) Prior Publication Data

US 2006/0105528 A1    May 18, 2006

(30) Foreign Application Priority Data

Nov. 17, 2004   (KR) .................... 10-2004-0094283

(51) Int. Cl.
*H01L 29/06* (2006.01)
*H01L 31/00* (2006.01)

(52) U.S. Cl. ............................ 257/19; 257/15; 257/20; 257/22; 257/E31.035; 257/E31.049; 257/E33.009

(58) Field of Classification Search ............ 257/15–22, 257/E33.009, E31.035, E31.049
See application file for complete search history.

(56) References Cited

U.S. PATENT DOCUMENTS 5,846,866 A    12/1998  Huang et al.
5,907,173 A    5/1999   Kwon et al.
6,620,688 B2   9/2003   Woo et al.

(Continued)

FOREIGN PATENT DOCUMENTS

JP    2002-368230    12/2002

(Continued)

OTHER PUBLICATIONS

'High Performance Power MOSFETs with Strained-Si Channel' Cho et al. 17th International Symposium On Power Semiconductor Devices and ICs, May 22-26, 2005.

*Primary Examiner*—Kenneth Parker
*Assistant Examiner*—Jesse A. Fenty
(74) *Attorney, Agent, or Firm*—Ladas & Parry LLP

(57) ABSTRACT

Provided are high voltage metal oxide semiconductor field effect transistor (HVMOSFET) having a Si/SiGe heterojunction structure and method of manufacturing the same. In this method, a substrate on which a Si layer, a relaxed SiGe epitaxial layer, a SiGe epitaxial layer, and a Si epitaxial layer are stacked or a substrate on which a Si layer having a well region, a SiGe epitaxial layer, and a Si epitaxial layer are stacked is formed. For the device having the heterojunction structure, the number of conduction carriers through a potential well and the mobility of the carriers increase to reduce an on resistance, thus increasing saturation current. Also, an intensity of vertical electric field decreases so that a breakdown voltage can be maintained at a very high level. Further, a reduction in vertical electric field due to the heterojunction structure leads to a gain in transconductance (Gm), with the results that a hot electron effect is inhibited and the reliability of the device is enhanced.

13 Claims, 11 Drawing Sheets

U.S. PATENT DOCUMENTS

| | | |
|---|---|---|
| 6,696,734 B2 | 2/2004 | Kikuchi et al. |
| 6,828,628 B2 * | 12/2004 | Hergenrother et al. ...... 257/335 |
| 6,873,015 B2 * | 3/2005 | Bhattacharyya ............. 257/350 |
| 2002/0109184 A1 | 8/2002 | Hower et al. |
| 2003/0062537 A1 * | 4/2003 | Sugii et al. ................. 257/192 |
| 2005/0077511 A1 * | 4/2005 | Fitzergald .................... 257/19 |
| 2006/0081836 A1 * | 4/2006 | Kimura et al. ................ 257/19 |

FOREIGN PATENT DOCUMENTS

| | | |
|---|---|---|
| JP | 2004-79887 | 3/2004 |
| JP | 2004 221543 | 8/2004 |
| KR | 20010055282 | 7/2001 |
| KR | 2002-0008789 | 1/2002 |
| WO | WO 03/019632 | 3/2003 |

* cited by examiner

HIGH VOLTAGE MOSFET HAVING SI/SIGE HETEROJUCTION STRUCTURE AND METHOD OF MANUFACTURING THE SAME

CROSS-REFERENCE TO RELATED APPLICATION

This application claims priority to and the benefit of Korean Patent Application No. 2004-94283, filed Nov. 17, 2004, the disclosure of which is incorporated herein by reference in its entirety.

BACKGROUND

1. Field of the Invention

The present invention relates to a power device and method of manufacturing the same and, more specifically, to a high voltage metal oxide semiconductor field effect transistor (HVMOSFET) having a Si/SiGe heterojunction structure and method of manufacturing the same, in which a breakdown voltage is held high and an on resistance is held low.

2. Discussion of Related Art

In general, power devices using a field effect include a lightly doped drain-high voltage MOSFET (LDD-HVMOSFET), a double diffused MOSFET (DMOSFET), an extended drain MOSFET (EDMOSFET), and a lateral double diffused MOSFET (LDMOSFET). These power devices are being watched with keen interest as high voltage devices because they operate at high switching speed and at a low on resistance in comparison to other power devices.

The field-effect power devices commonly include a drain that is comprised of a lightly doped region and a heavily doped region. The drain has a heterojunction structure obtained by performing an ion implantation process twice. Thus, a hot electron effect, which arises from an increase in the intensity of a vertical electric field at the end of a channel close to the drain, can be diminished. The hot electron effect leads to reductions in a small-signal output resistance and a transconductance (Gm), trapping of electrons in an oxide layer to increase a threshold voltage, and generation of a substrate current. The generated substrate current induces the operation of a parasitic bipolar transistor (BJT) between a source, a substrate, and a drain, thus a breakdown voltage $V_{DS}$ decreases. Accordingly, a power device should be structured such that it has a high breakdown voltage to resist to a high voltage and has a low on resistance to hold switching speed high.

FIG. 1 is a cross sectional view of a basic high voltage device, specifically, a conventional LDD-HVMOSFET.

Referring to FIG. 1, the HVMOSFET is manufactured in a semiconductor substrate 10 in which a p-well region 41 and an n-well region 51 are formed. The HVMOSFET is comprised of an N-type LDD-HVMOSFET formed in the p-well region 41 and a P-type LDD-HVMOSET formed in the n-well region 51.

A gate oxide layer 19 is formed on the p-well region 41 over the p-type semiconductor substrate 10 on which a field oxide layer 21 is formed, and a gate electrode 20 is formed on the gate oxide layer 19. An $n^+$ source region 16 including an $n^-$ LDD region 15 and an $n^+$ drain region 17 are formed in the p-well region 41 on both sides of the gate electrode 20, respectively. A $p^+$ source contact region 18 is formed on one side of the $n^+$ source region 16, and an n-type drift region 14 is formed outside the $n^+$ drain region 17. In the above-described N-type LDD-HVMOSFET, respective portions of the gate electrode 20, the $n^+$ source region 16, the $p^+$ source contact region 18, and the $n^+$ drain region 17 are connected to metal electrodes 23 through contact holes formed in an interlayer dielectric layer 22.

Also, the gate oxide layer 19 is formed on the n-well region 51 over the p-type semiconductor substrate 10, and the gate electrode 20 is formed on the gate oxide layer 19. A $p^+$ source region 56 including a $p^-$ LDD region 55 and a $p^+$ drain region 57 are formed in the n-well region 51 on both sides of the gate electrode 20, respectively. An $n^+$ source contact region 58 is formed on one side of the $p^+$ source region 56, and a p-type drift region 54 is formed outside the $p^+$ drain region 57. In the above-described P-type LDD-HVMOSFET, respective portions of the gate electrode 20, the $p^+$ source region 56, the $n^+$ source contact region 58, and the $p^+$ drain region 57 are connected to metal electrodes 23 through contact holes formed in the interlayer dielectric layer 22.

In the N-type LDD-HVMOSFET, when a higher voltage than a threshold voltage is applied to the gate electrode 20 and a higher voltage is applied to the drain region 17 than the source region 16, a current flows from the source region 16 through a channel region disposed under the gate electrode 20 and the n-type drift region 14 into the drain region 17. In this process, the dispersion of an electric field in the lightly doped n-type drift region 14 can be obtained, thus lowering the maximum electric field intensity to ensure a high breakdown voltage. However, a low dopant concentration of the n-type drift region 14 makes it difficult to precisely control the on resistance of the channel region and precludes ensuring a low on resistance so as not to obtain a high driving current.

Since the P-type LDD-HVMOSFET operates on the same principle as the above-described N-type LDD-HVMOSFET, a detailed description thereof will be omitted here.

SUMMARY OF THE INVENTION

The present invention is directed to a high voltage metal oxide semiconductor field effect transistor (HVMOSFET) and method of manufacturing the same, in which a channel has a Si/SiGe heterojunction structure so that a difficulty in ensuring a low on resistance due to a lightly doped n-type drift region and a reduction in transconductance (Gm) caused by a hot electron effect are overcome and also, a high breakdown voltage can be obtained.

One aspect of the present invention is to provide an HVMOSFET including a substrate on which a Si layer, a relaxed SiGe epitaxial layer, a SiGe epitaxial layer, and a Si epitaxial layer are stacked; a gate disposed over the substrate and electrically isolated from the substrate by a gate insulating layer; a source region disposed in the Si epitaxial layer and the SiGe epitaxial layer under one lateral portion of the gate; a drift region disposed in the Si epitaxial layer and the SiGe epitaxial layer under the other lateral portion of the gate; and a drain region disposed in the drift region.

Another aspect of the present invention is to provide an HVMOSFET including a substrate on which a Si layer having a well region, a SiGe epitaxial layer, and a Si epitaxial layer are stacked; a gate disposed over the substrate and electrically isolated from the substrate by a gate insulating layer; a source region disposed in the Si epitaxial layer, the SiGe epitaxial layer, and the well region under one lateral portion of the gate; a drift region disposed in the Si epitaxial layer, the SiGe epitaxial layer, and the well region under the other lateral portion of the gate; and a drain region disposed in the drift region.

Still another aspect of the present invention is to provide a method of manufacturing an HVMOSFET including forming a substrate on which a Si layer, a relaxed SiGe epitaxial layer, a SiGe epitaxial layer, and a Si epitaxial layer are stacked; forming a drift region by implanting impurity ions into predetermined portions of the Si epitaxial layer and the SiGe epitaxial layer; forming a gate oxide layer on the Si epitaxial layer in an active region; forming a gate on the gate oxide layer and forming a lightly doped drain (LDD) region in the Si epitaxial layer and the SiGe epitaxial layer under one lateral portion of the gate; and forming a source region and a drain region in the Si epitaxial layer and the SiGe epitaxial layer under both lateral portions of the gate.

Further another aspect of the present invention is to provide a method of manufacturing an HVMOSFET including forming a substrate on which a Si layer having a well region, a SiGe epitaxial layer, and a Si epitaxial layer are stacked; forming a drift region by implanting impurity ions into predetermined portions of the Si epitaxial layer, the SiGe epitaxial layer, the well region; forming a gate oxide layer on the Si epitaxial layer in an active region; forming a gate on the gate oxide layer and forming an LDD region in the Si epitaxial layer, the SiGe epitaxial layer, and the well region under one lateral portion of the gate; forming a source region and a drain region in the Si epitaxial layer, the SiGe epitaxial layer, and the well region under both lateral portions of the gate.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art.

FIGS. 2A through 2F are cross-sectional views illustrating a method of manufacturing a high voltage metal oxide semiconductor field effect transistor (HVMOSFET) having a heterojunction structure according to an exemplary embodiment of the present invention.

Figure 1:
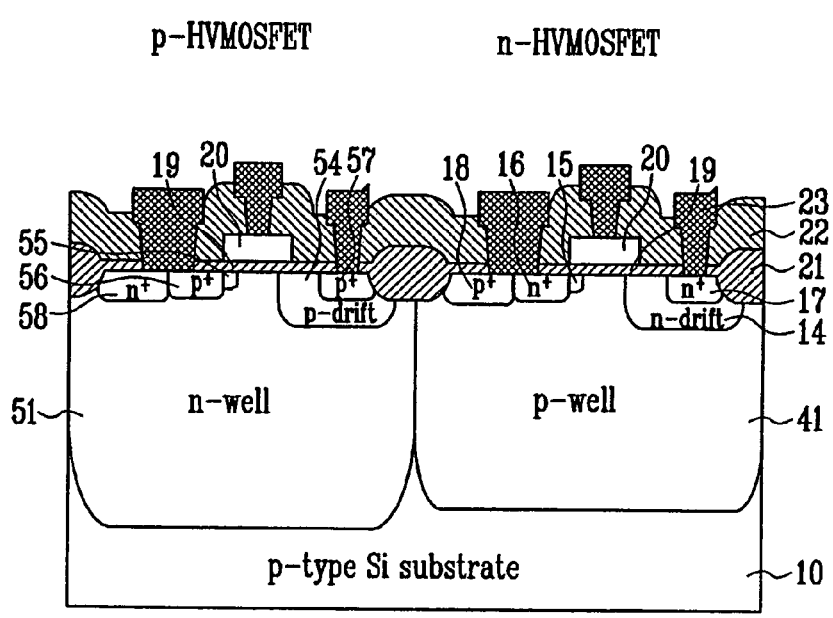
FIG. 1 is a cross-sectional view of a conventional lightly doped drain-high voltage MOSFET (LDD-HVMOSFET)
Figure 2A:
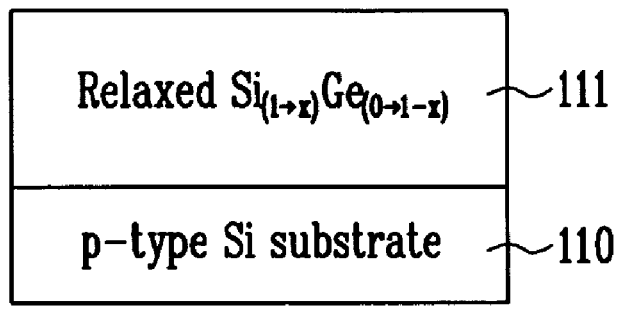
FIGS. 2A through 2F are cross-sectional views illustrating a method of an HVMOSFET according to an exemplary embodiment of the present invention.

Referring to FIG. 2A, a relaxed $Si_{(1-x)}Ge_{(0 \to 1-x)}$ epitaxial layer 111 is formed on a silicon substrate 110. The relaxed $Si_{(1-x)}Ge_{(0 \to 1-x)}$ epitaxial layer 111 is formed to a sufficient thickness of about 0.5 μm or more, a Ge content (x) is gradually increased from 0% to x %, and a final Ge content may become about 10 to 20%.

Figure 2B:
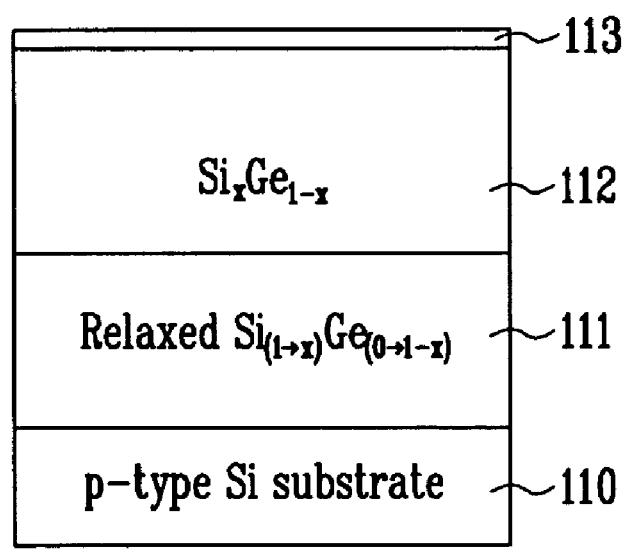

Referring to FIG. 2B, a $Si_xGe_{1-x}$ epitaxial layer 112 is formed on the relaxed $Si_{(1-x)}Ge_{(0 \to 1-x)}$ epitaxial layer 111. The $Si_xGe_{1-x}$ epitaxial layer 112 is formed to a thickness of about 0.5 μm or more, but may have a greater thickness than a diffused thickness of an n⁻ drift region in order to minimize a substrate current. Also, the $Si_xGe_{1-x}$ epitaxial layer 112 is formed at about the same dopant concentration as a silicon substrate used in the fabrication of a typical power device.

A Si epitaxial layer 113 is formed on the $Si_xGe_{1-x}$ epitaxial layer 112. The Si epitaxial layer 113 is formed to an appropriate thickness considering a thickness to be consumed during subsequent processes, specifically, an annealing process, a process of forming a gate oxide layer, and a cleaning process. If the Si epitaxial layer 113 is finally left to too small a thickness, a channel is formed in the $Si_xGe_{1-x}$ epitaxial layer 112. Thus, the electron mobility in the channel decreases to reduce an on resistance. In contrast, if the Si epitaxial layer 113 is left to too great a thickness, an increase of current in the $Si_xGe_{1-x}$ epitaxial layer 112, which results from electrons trapped in the channel, cannot be expected. Therefore, after the subsequent processes are undergone, the Si epitaxial layer 113 may be finally left to a thickness of about 4 to 20 nm. When the Si epitaxial layer 113 is grown on the $Si_xGe_{1-x}$ epitaxial layer 112 to a small thickness, a strained-Si effect may be additionally obtained.

In the present embodiment, a substrate comprised of $Si/Si_xGe_{1-x}$/relaxed $Si_xGe_{1-x}$/Si is manufactured using epitaxial growth processes, so that the impurity concentration of the substrate can be freely controlled. In other words, because an n-type impurity layer is formed between epitaxial layers using an epitaxial growth process, it can be electrically isolated from a p-type epitaxial layer, thus dramatically reducing a substrate current.

Figure 2C:
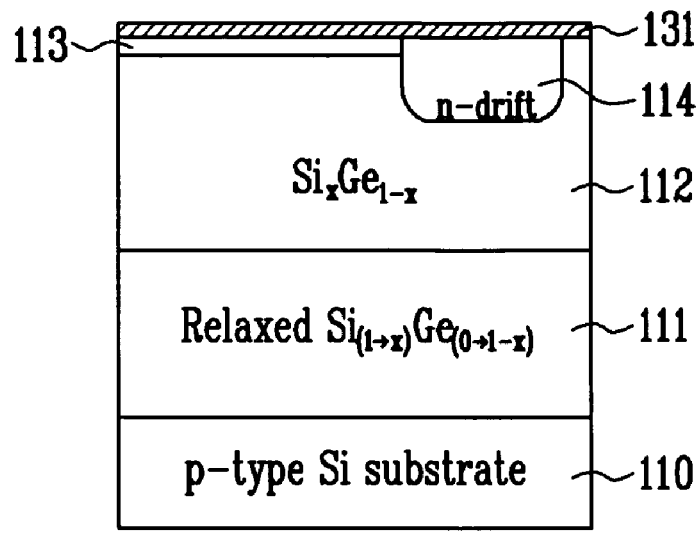

Referring to FIG. 2C, the Si epitaxial layer 113 is oxidized to a partial thickness, thereby forming a sacrificial oxide layer 131. Impurity ions are implanted into predetermined portions of the Si epitaxial layer 113 and the $Si_xGe_{1-x}$ epitaxial layer 112, thereby forming an n⁻-type drift region 114. In this process, phosphorus (P) ions are implanted at an energy of about 60 KeV and at a dose of about 2.0E13 atoms/cm² and diffused at a temperature of about 1000° C. for about 500 minutes. The foregoing specific numerical values may vary according to process conditions and circumstances. Here, the distortion of a doping profile may arise from a difference in diffusivity of impurities between Si and SiGe. However, since the diffusivity of P ions makes little difference therebetween, the distortion of the doping profile is negligible.

Figure 2D:
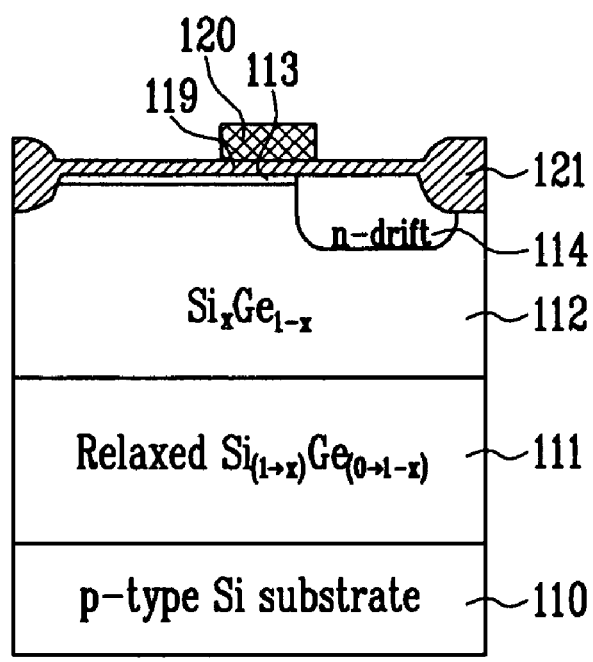

Referring to FIG. 2D, after the sacrificial oxide layer 131 is removed, a field oxide layer 121 is formed in an isolation region, and a gate oxide layer 119 is formed on the Si epitaxial layer 113 in an active region. In this case, the Si epitaxial layer 113 is finally left to a thickness of about 4 to 20 nm. The thickness of the gate oxide layer 119 may be appropriately controlled according to the type of device. Also, $BF_2$ ions may be implanted to elevate a threshold voltage of a p-type MOS capacitor formed in the field oxide layer 121, and B and $BF_2$ ions may be implanted to control both a threshold voltage and a leakage current.

To form a gate, polysilicon (poly-Si) is deposited on the gate oxide layer 119 to a thickness of about 1500 Å and doped with $POCl_3$ ions at a temperature of 850° C. for about 30 minutes. In this case, a tungsten-silicide (WSix) or metal-silicide forming process may be additionally performed to reduce the sheet resistance of the gate. Thereafter, a gate 120 is formed by patterning the poly-Si such that one lateral portion of the gate 120 overlaps a portion of the $n^-$-type drift region 114.

Figure 2E:
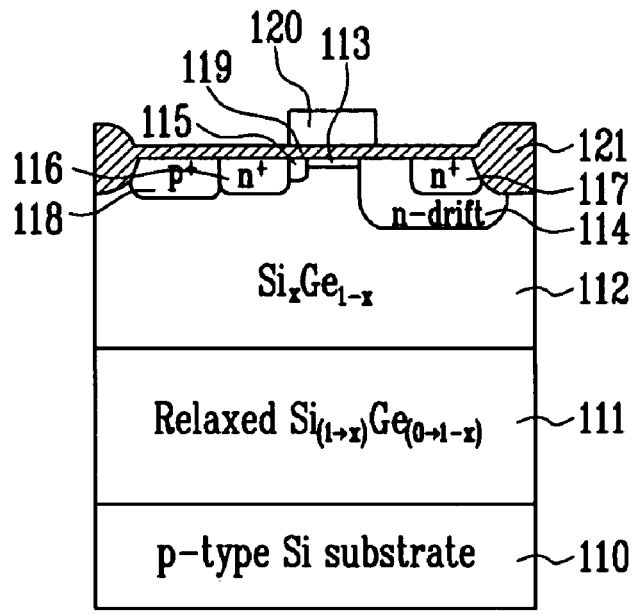

Referring to FIG. 2E, P ions are implanted into the Si epitaxial layer 113 and the $Si_xGe_{1-x}$ epitaxial layer 112 under the other lateral portion of the gate 120 at an energy of about 40 KeV and at a dose of about $3.5E13$ atoms/cm$^2$ and diffused at a temperature of 900° C. for 30 minutes, thereby forming an LDD region 115. Then, arsenic (As) ions are implanted into the Si epitaxial layer 113 and the $Si_xGe_{1-x}$ epitaxial layer 112 under both lateral portions of the gate 120 at an energy of about 60 KeV and at a dose of about $6.0E15$ atoms/cm$^2$ and diffused at a temperature of 900° C. for 30 minutes, thereby forming an $n^+$-type source region 116 and an $n^+$-type drain region 117. In this case, the $n^+$-type drain region 117 is formed inside the $n^-$-type drift region 114. Here, the formation of the LDD region 115 may be additionally followed by a process of forming spacers on both sidewalls of the gate 120 such that the $n^+$-type source and drain regions region 116 and 117 are spaced a predetermined distance apart from the gate 120.

Subsequently, $p^+$-type impurities are implanted at a high dose into the Si epitaxial layer 113 and the $Si_xGe_{1-x}$ epitaxial layer 112 on one side of the $n^+$-type source region 116, thereby forming a $p^+$-type source contact region 118 for a body contact.

Figure 2F:
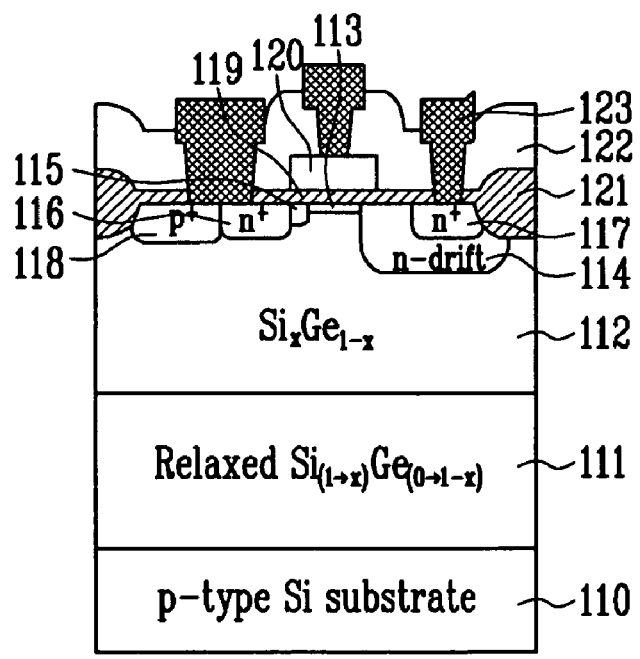

Referring to FIG. 2F, an interlayer dielectric layer 122 is formed on the entire surface of the resultant structure, and contact holes are formed in the interlayer dielectric layer 122 to expose respective portions of the gate 120, the $n^+$-type source region 116, the $p^+$-type source contact region 118, and the $n^+$-type drain region 117. A metal layer is deposited on the entire surface of the resultant structure to fill the contact holes and patterned, thereby forming metal electrodes 123, which contact respective ones of the gate 120, the $n^+$-type source region 116, the $p^+$-type source contact region 118, and the $n^+$-type drain region 117.

Although only the manufacture of the N-type LDD-HVMOSFET is described with reference to FIGS. 2A through 2F, a P-type LDD-HVMOSFET also can be obtained through the same manufacturing processes as described above while varying the types of impurities.

FIGS. 3A through 3F are cross-sectional views illustrating a method of manufacturing an HVMOSFET having a heterojunction structure according to another exemplary embodiment of the present invention.

Figure 3A:
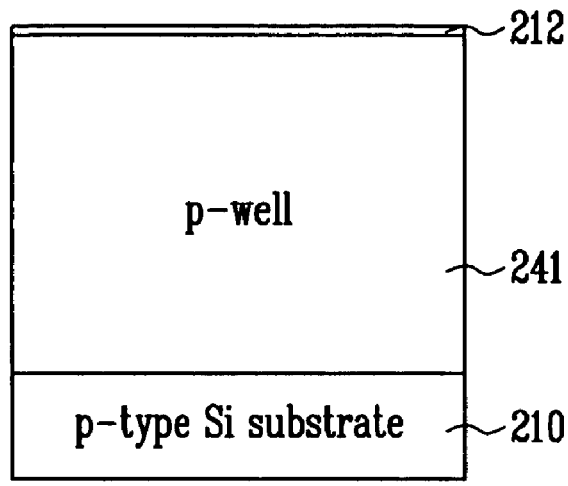
FIGS. 3A through 3F are cross-sectional views illustrating a method of an HVMOSFET according to another exemplary embodiment of the present invention.

Referring to FIG. 3A, a $Si_xGe_{1-x}$ epitaxial layer 212 is formed over a silicon substrate 210 on which a p-well region 241 is formed. The $Si_xGe_{1-x}$ epitaxial layer 212 is formed to such a small thickness of about 10 to 50 nm that defects caused by lattice mismatch are prevented, and a Ge content may become about 10 to 30% to maximize the characteristics of a device. In this case, a doping process is performed in-situ, and the $Si_xGe_{1-x}$ epitaxial layer 212 is formed at about the same dopant concentration as a typical power device. Also, to reduce a leakage current, a silicon on insulator (SOI) substrate may be employed in place of an ordinary silicon substrate.

Figure 3B:
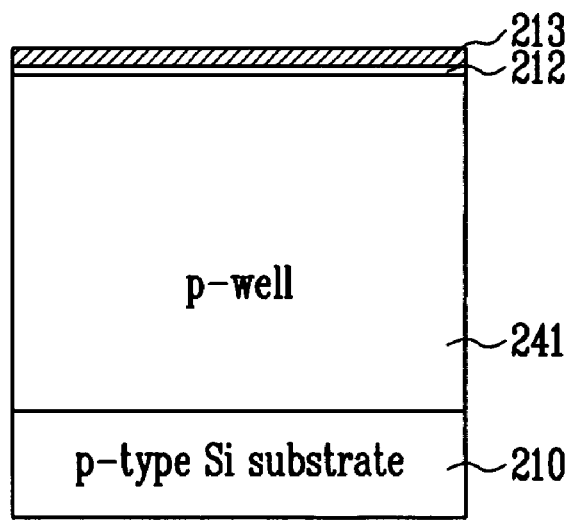

Referring to FIG. 3B, a Si epitaxial layer 213 is formed on the $Si_xGe_{1-x}$ epitaxial layer 212. The Si epitaxial layer 213 is formed to an appropriate thickness considering a thickness to be consumed during subsequent processes, specifically, an annealing process, a process of forming a gate oxide layer, and a cleaning process. For the same reason as in the first embodiment, the Si epitaxial layer 213 may be finally left to a thickness of about 4 to 20 nm.

In the present embodiment, a substrate comprised of $Si/Si_xGe_{1-x}/Si$ is manufactured using epitaxial growth processes as described above. The substrate obtained in the present embodiment exhibits different characteristics from the substrate obtained in the first embodiment.

Figure 3C:
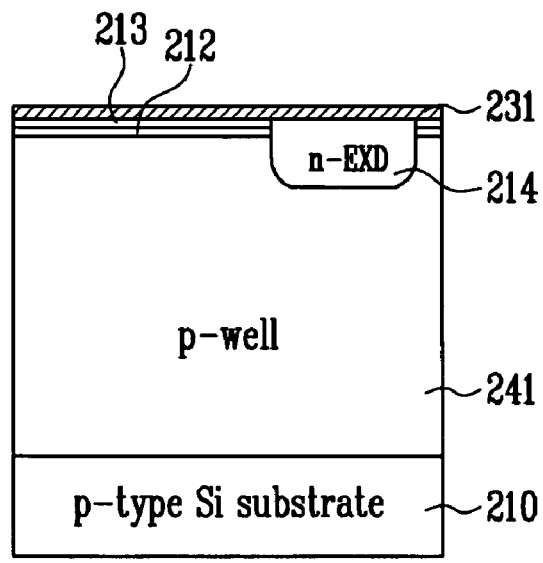

Referring to FIG. 3C, the Si epitaxial layer 213 is oxidized to a partial thickness, thereby forming a sacrificial oxide layer 231. Impurity ions are implanted into predetermined portions of the Si epitaxial layer 213, the $Si_xGe_{1-x}$ epitaxial layer 212, and the p-well region 241, thereby forming an $n^-$-type drift region 214. In this process, P ions are implanted at an energy of about 60 KeV and at a dose of about $2.0E13$ atoms/cm$^2$ and diffused at a temperature of about 1000° C. for about 500 minutes. The foregoing specific numerical values may vary according to process conditions and circumstances. Here, the distortion of a doping profile may arise from a difference in diffusivity of impurities between Si and SiGe. However, since the diffusivity of P ions makes little difference therebetween, the distortion of the doping profile is negligible.

Figure 3D:
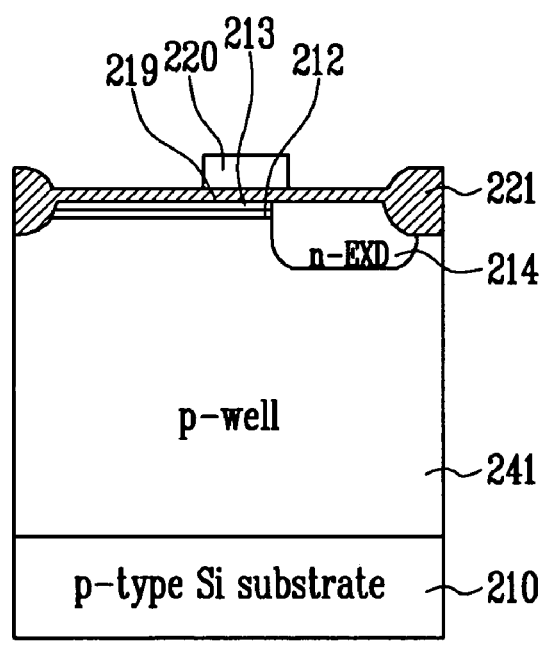

Referring to FIG. 3D, after the sacrificial oxide layer 231 is removed, a field oxide layer 221 is formed in an isolation region, and a gate oxide layer 219 is formed on the Si epitaxial layer 213 in an active region. In this case, the Si epitaxial layer 213 is finally left to a thickness of about 4 to 20 nm. The thickness of the gate oxide layer 219 may be appropriately controlled according to the type of device. Also, $BF_2$ ions may be implanted to elevate a threshold voltage of a p-type MOS capacitor formed in the field oxide layer 221, and B and $BF_2$ ions may be implanted to control both a threshold voltage and a leakage current.

To form a gate, poly-Si is deposited on the gate oxide layer 219 to a thickness of about 1500 Å and doped with $POCl_3$ ions at a temperature of 850° C. for about 30 minutes. In this case, a WSix or metal-silicide forming process may be additionally performed to reduce the sheet resistance of the gate. Thereafter, a gate 220 is formed by patterning the poly-Si such that one lateral portion of the gate 220 overlaps a portion of the $n^-$-type drift region 214.

Figure 3E:
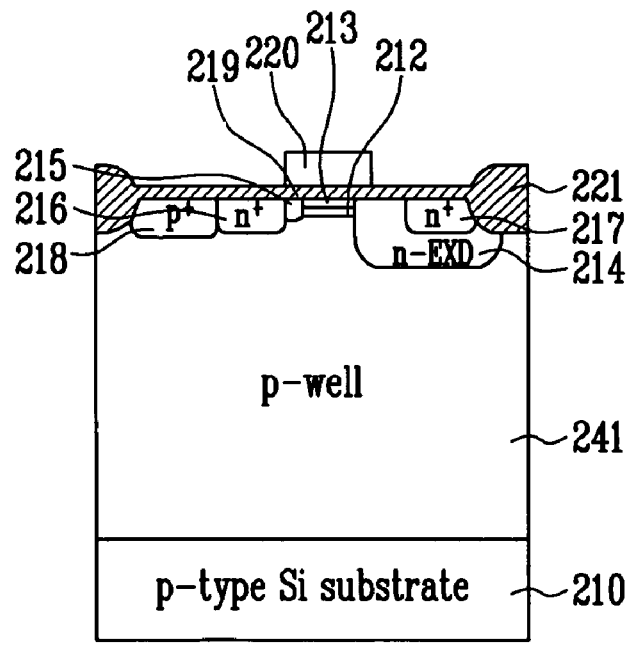

Referring to FIG. 3E, P ions are implanted into the Si epitaxial layer 213, the $Si_xGe_{1-x}$ epitaxial layer 212, and the p-well region 241 under the other lateral portion of the gate 220 at an energy of about 40 KeV and at a dose of about $3.5E13$ atoms/cm$^2$ and diffused at a temperature of 900° C. for 30 minutes, thereby forming an LDD region 215. Then, As ions are implanted into the Si epitaxial layer 213, the $Si_xGe_{1-x}$ epitaxial layer 212, and the p-well region 241 under both lateral portions of the gate 220 at an energy of about 60 KeV and at a dose of about 6.0E 15 atoms/cm$^2$ and diffused at a temperature of 900° C. for 30 minutes, thereby forming an n$^+$-type source region 216 and an n$^+$-type drain region 217. In this case, the n$^+$-type drain region 217 is formed inside the n$^-$-type drift region 214. Here, the formation of the LDD region 215 may be additionally followed by a process of forming spacers on both sidewalls of the gate 220 such that the n$^+$-type source and drain regions region 216 and 217 are spaced a predetermined distance apart from the gate 220.

Subsequently, p$^+$-type impurities are implanted at a high dose into the Si epitaxial layer 213, the Si$_x$Ge$_{1-x}$ epitaxial layer 212, and the p-well region 241 on one side of the n$^+$-type source region 216, thereby forming a p$^+$-type source contact region 218 for a body contact.

Figure 3F:
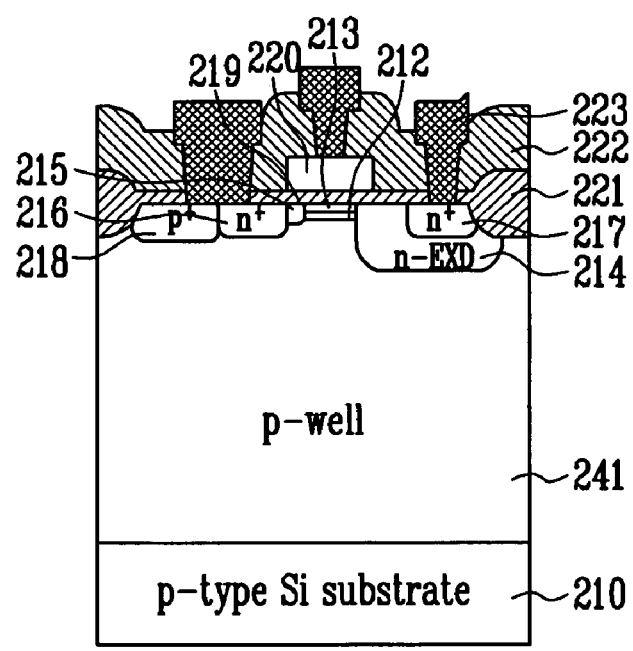

Referring to FIG. 3F, an interlayer dielectric layer 222 is formed on the entire surface of the resultant structure, and contact holes are formed in the interlayer dielectric layer 222 to expose respective portions of the gate 220, the n$^+$-type source region 216, the p$^+$-type source contact region 218, and the n$^+$-type drain region 217. A metal layer is deposited on the entire surface of the resultant structure to fill the contact holes and patterned, thereby forming metal electrodes 223, which contact respective ones of the gate 220, the n$^+$-type source region 216, the p$^+$-type source contact region 218, and the n$^+$-type drain region 217.

Although only the manufacture of the N-type LDD-HVMOSFET is described with reference to FIGS. 3A through 3F, a P-type LDD-HVMOSFET also can be obtained through the same manufacturing processes as described above while varying the types of impurities.

Figure 4:
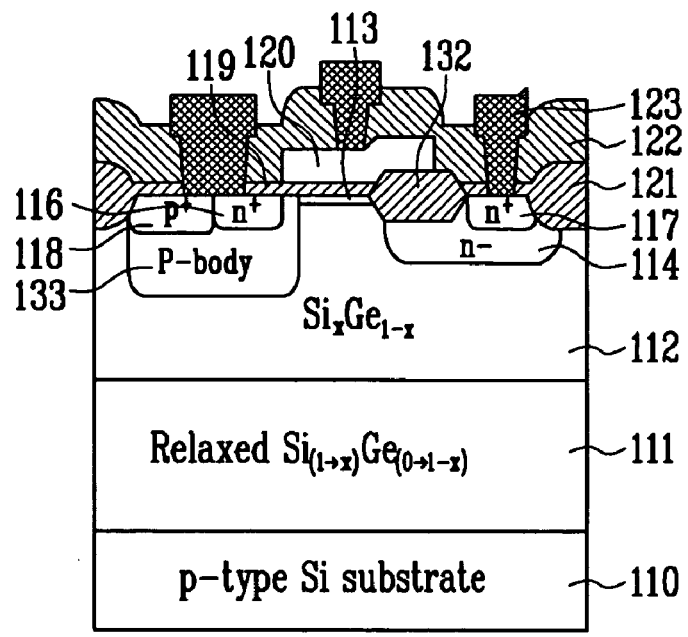
FIGS. 4 and 5 are cross-sectional views of HVMOSFETs according to yet another exemplary embodiment of the present invention.
Figure 5:
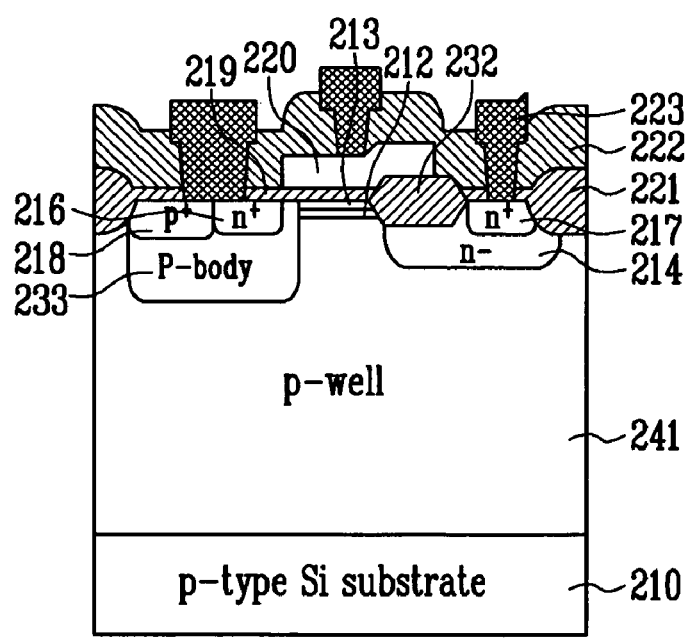

FIGS. 4 and 5 are cross-sectional views of LDMOSFETs that are manufactured through the same processes as in the first and second embodiments, respectively. The present invention is not limited to the foregoing embodiments, but a channel having a Si/SiGe heterojunction structure can be embodied in various forms.

In FIG. 4, reference numeral 133 denotes a p-type body and 132 denotes a partial oxide layer. In FIG. 5, reference numeral 233 denotes a p-type body and 232 denotes a partial oxide layer.

FIGS. 6 through 10 are graphs showing simulation results of a comparison of an LDD-HVMOSFET manufactured according to the first embodiment and an LDD-HVMOSFET manufactured according to a conventional method (hereinafter, a conventional LDD-HVMOSFET). In FIGS. 6 through 10, simulation operations were executed using a Silvaco's simulator under the same conditions except an epitaxial structure of a channel.

Figure 6:
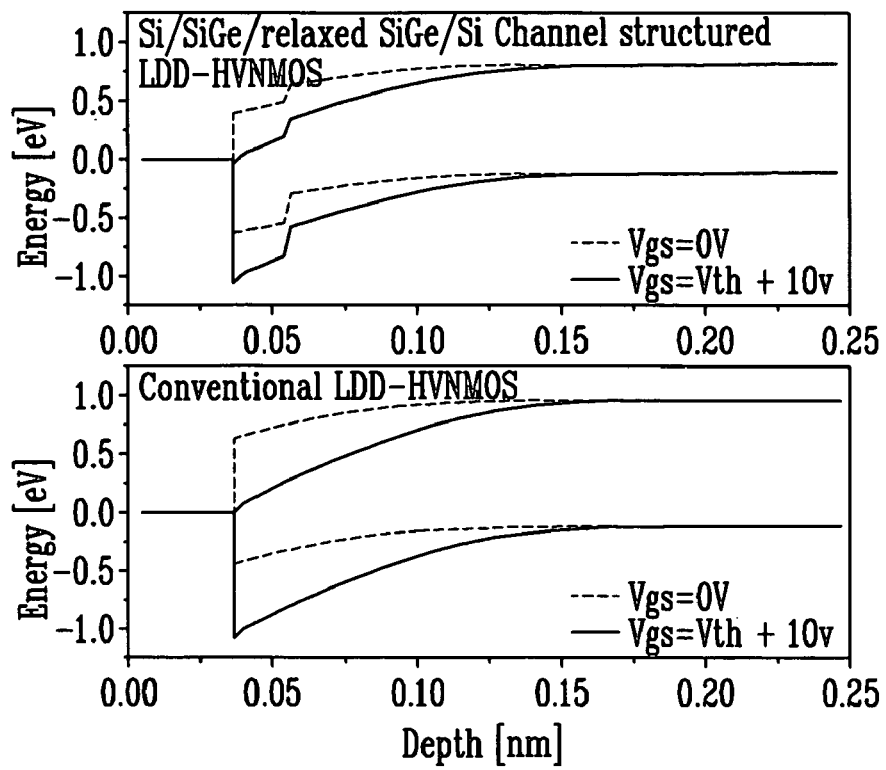
FIG. 6 is a graph showing simulation results of energy band diagrams and the distributions of conduction carrier concentrations in LDD-HVNMOS devices according to the first embodiment of the present invention and a conventional process.
Figure 7:
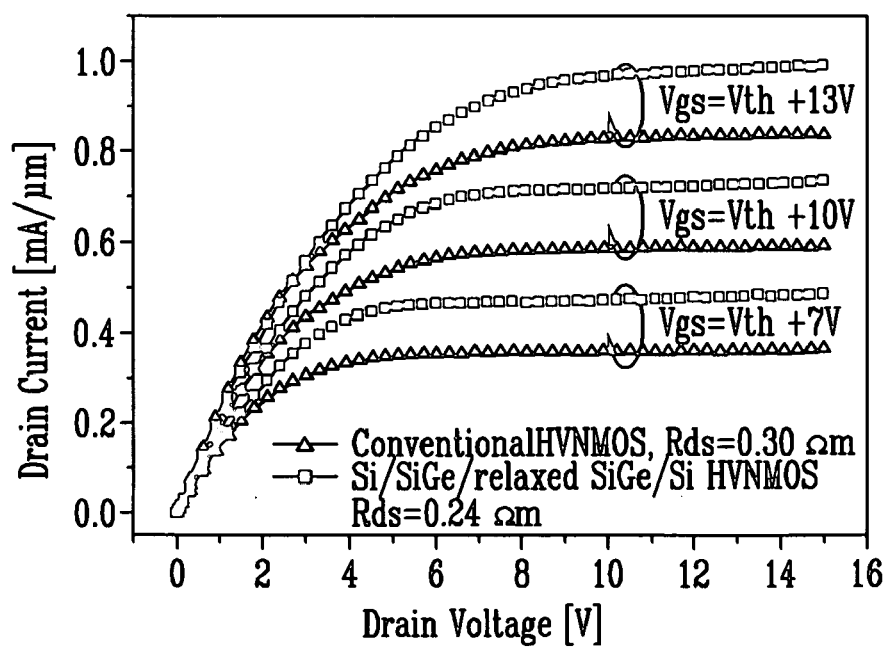
FIG. 7 is a graph showing simulation results of current-voltage (IV) characteristics of LDD-HVNMOS devices according to the first embodiment of the present invention and the conventional process.

FIG. 6 shows energy bands when no voltage is applied to a gate and when a sufficient inversion voltage is applied to the gate. In the heterojunction structure according to the present invention, a potential well is formed between Si and SiGe, thus the distribution of carrier concentration increases. Owing to a reduction in the effective mass of electrons due to a strained-Si effect, the mobility of the electrons grows high to decrease an on resistance between a source and a drain. Hence, the slope of a saturated current is as shown in FIG. 7. As can be seen from FIG. 7, the saturated current was increased by 20% or higher.

Figure 8A:
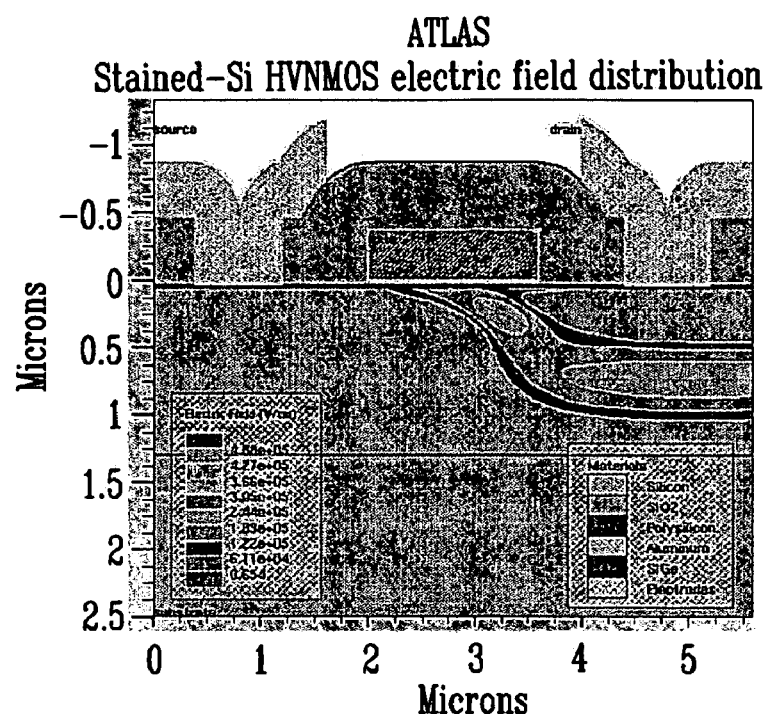
FIGS. 8A and 8B are graphs showing simulation results of electric field distributions of LDD-HVNMOS devices according to the first embodiment of the present invention and the conventional process.
Figure 8B:
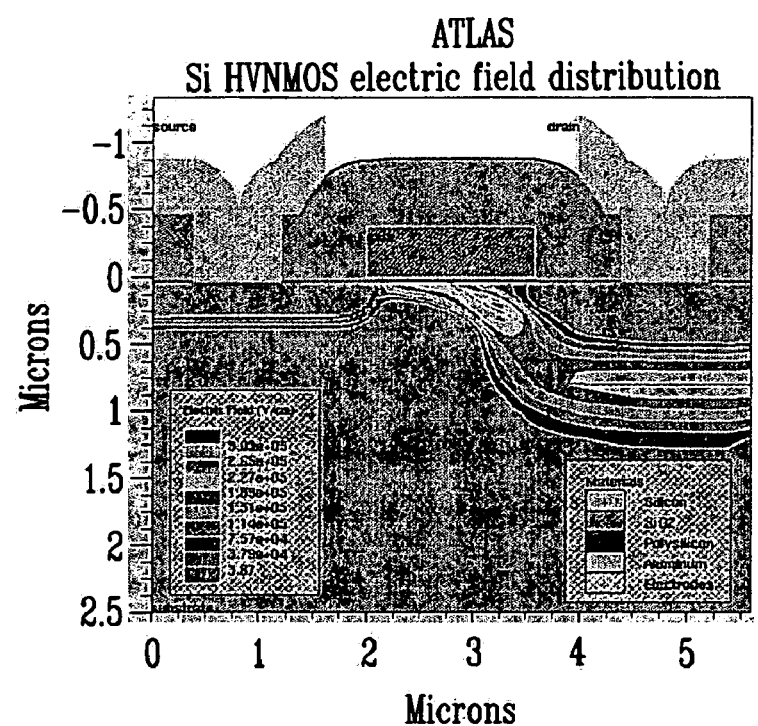

FIGS. 8A and 8B show the distribution of electric field relative to channel depth in an LDD-HVNMOS device according to the first embodiment and a conventional LDD-HVNMOS device. On comparing the two LDD-HVNMOSs, it can be seen that the maximum electric field intensity decreased in the device according to the first embodiment as shown in FIG. 8A. In conclusion, a channel structure according to the first or second embodiment can resist to a much higher electric field than the conventional device with a Si channel, thus it can have a nearly the same breakdown voltage.

Figure 9:
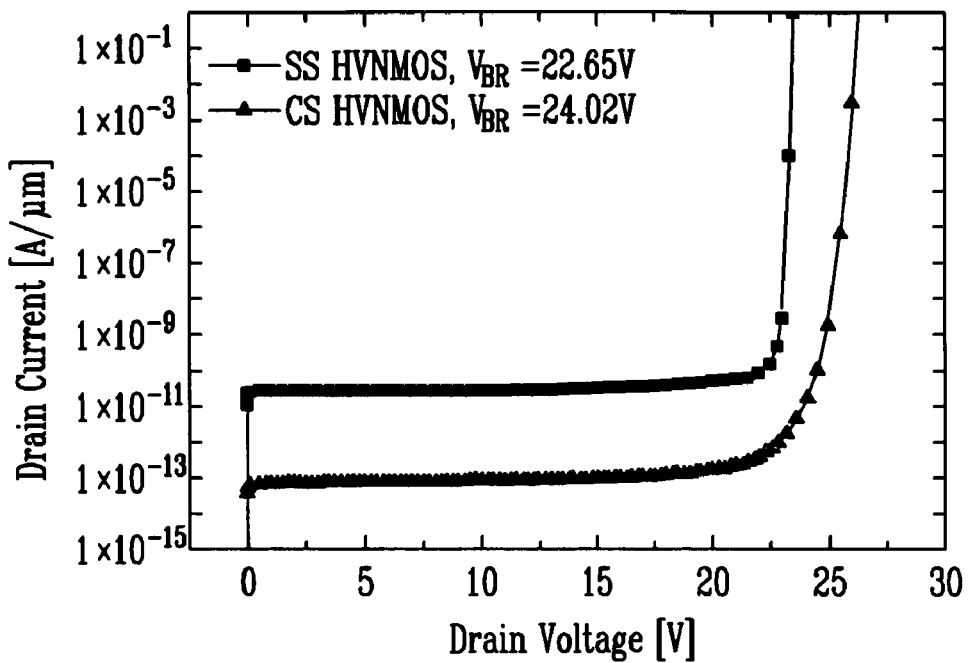
FIG. 9 is a graph showing simulation results of breakdown voltage characteristics of LDD-HVNMOS devices according to the first embodiment of the present invention and the conventional process.

FIG. 9 shows breakdown voltages of an LDD-HVNMOS according to the first embodiment and a conventional LDD-HVNMOS. As can be seen from FIG. 9, the power device according to the first embodiment exhibit a breakdown characteristics very close to that of the conventional LDD-HVNMOS. Since the first embodiment has nearly the same breakdown characteristic, it is concluded that the proposed device has nearly the same high voltage characteristics.

Figure 10:
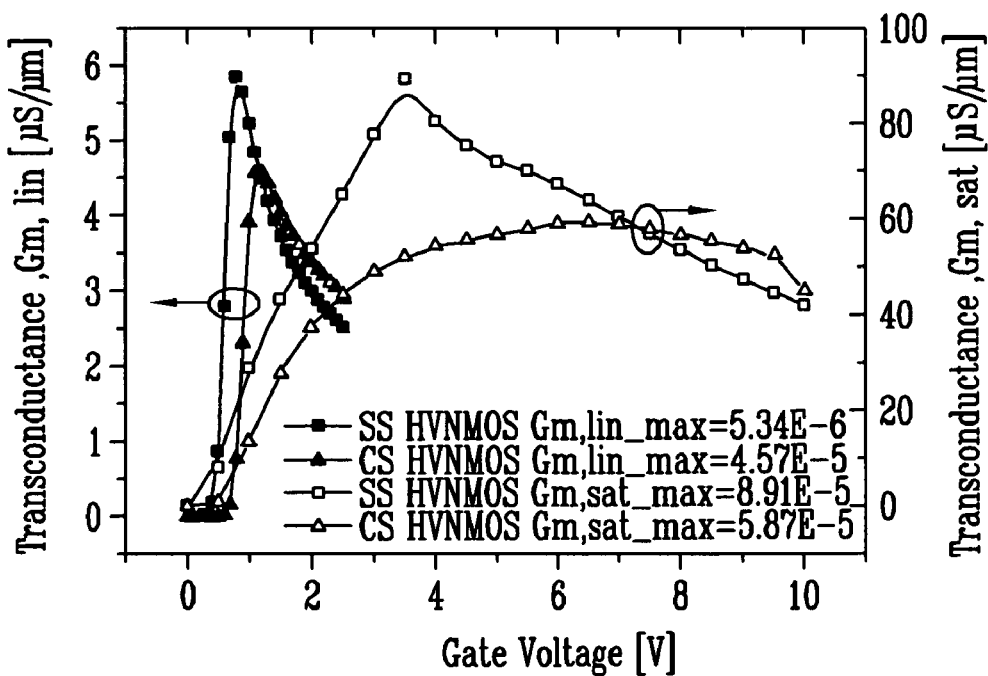
FIG. 10 is a graph showing simulation results of transconductances (Gm) of LDD-HVNMOS devices according to the first embodiment of the present invention and the conventional process.

FIG. 10 shows transconductances (Gm) of an LDD-HVNMOS according to the first embodiment and a conventional LDD-HVNMOS. As can be seen from FIG. 10, a channel structure according to the first embodiment leads to a 50% or higher increase in the maximum value of transconductance (Gm). As a result, a hot electron effect can be diminished using the Si/SiGe heterojunction structure, thus enhancing the reliability of a device.

According to the present invention as described above, the HVMOSFET has a Si/SiGe heterojunction structure. In this structure, the number of carriers through a potential well and the mobility of the carriers increase to reduce an on resistance between a source and a drain, thus increasing saturation current. Also, an electric field intensity decreases due to the heterojunction structure so that a breakdown voltage can be maintained at a nearly same level under the same doping profile. Further, a reduction in electric field leads to a gain in transconductance (Gm), with the results that a hot electron effect is inhibited and the reliability of the device is enhanced.

In the drawings and specification, there have been disclosed typical preferred embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A high voltage metal oxide semiconductor field effect transistor, comprising:
 a base substrate comprising:
  a Si substrate;
  a relaxed SiGe epitaxial layer formed on at least a portion of the Si substrate;
  a SiGe epitaxial layer formed on at least a portion of the relaxed SiGe epitaxial layer; and
  a Si epitaxial layer formed on at least a portion of the SiGe epitaxial layer;
 a gate insulating layer formed on at least a portion of the base substrate
 a gate formed over the base substrate and electrically isolated from the base substrate by the gate insulating layer;
 a source region formed at least in a first portion on or in the SiGe epitaxial layer near the gate;
 a drift region formed in a second portion of the SiGe epitaxial layer near the gate; and
 a drain region formed in a predetermined portion of the drift region.

2. The transistor according to claim 1, wherein the relaxed SiGe epitaxial layer is formed of relaxed Si$_{(1-x)}$Ge$_{(0 \to 1-x)}$, such that a Ge content by weight is gradually increased from 0% to any in the range of 10% to 20% by gradually varying x from 100% to any in the range of 80 to 90%.

3. The transistor according to claim 1, wherein the SiGe epitaxial layer has a greater thickness than a diffused thickness of the drift region.

4. The transistor according to claim 1, wherein the Si epitaxial layer has a thickness of about 4 to 20 nm.

5. The transistor according to claim 1, wherein the gate partially overlaps the drift region.

6. The transistor according to claim 1, wherein the source region has a lightly doped drain (LDD) structure.

7. The transistor according to claim further comprising a source contact region disposed on one side of the source region.

8. A high voltage metal oxide semiconductor field effect transistor, comprising:
   a base substrate comprising:
      a Si substrate
      a well region formed on at least a portion of the Si substrate;
      a SiGe epitaxial layer formed on at least a portion of the well region;
      a Si epitaxial layer formed on at least a portion of the SiGe epitaxial layer;
   a gate insulating layer formed on at least a portion of the base substrate
   a gate formed above the base substrate and electrically isolated from the base substrate by the gate insulating layer;
   a source region formed at least in a first portion on or in the well region near the gate;
   a drift region formed at least in a second portion on or in the well region near the gate; and
   a drain region formed in a predetermined portion of the drift region.

9. The transistor according to claim 8, wherein the SiGe epitaxial layer has a greater thickness than a diffused thickness of the drift region.

10. The transistor according to claim 8, wherein the Si epitaxial layer has a thickness of about 4 to 20 nm.

11. The transistor according to claim 8, wherein the gate partially overlaps the drift region.

12. The transistor according to claim 8, wherein the source region has a lightly doped drain (LDD) structure.

13. The transistor according to claim 8, further comprising a source contact region disposed on one side of the source region.

* * * * *